(12) United States Patent
Clemenzi et al.

(10) Patent No.: US 11,632,078 B2
(45) Date of Patent: Apr. 18, 2023

(54) ADVANCED SOLAR PV SYSTEM WITH ROBOTIC ASSEMBLY

(71) Applicant: Intelli-Products Inc., Asheville, NC (US)

(72) Inventors: Richard A Clemenzi, Asheville, NC (US); Judith A Siglin, Asheville, NC (US)

(*) Notice: Subject to any disclaimer, the term of this patent is extended or adjusted under 35 U.S.C. 154(b) by 187 days.

(21) Appl. No.: 16/086,001

(22) PCT Filed: Mar. 18, 2017

(86) PCT No.: PCT/US2017/023109
§ 371 (c)(1),
(2) Date: Sep. 17, 2018

(87) PCT Pub. No.: WO2017/161358
PCT Pub. Date: Sep. 21, 2017

(65) Prior Publication Data
US 2021/0211096 A1    Jul. 8, 2021

Related U.S. Application Data

(60) Provisional application No. 62/458,842, filed on Feb. 14, 2017, provisional application No. 62/323,609, (Continued)

(51) Int. Cl.
*H02S 40/32* (2014.01)
*H02S 40/36* (2014.01)
(Continued)

(52) U.S. Cl.
CPC .............. *H02S 99/00* (2013.01); *B25J 11/00* (2013.01); *G05B 15/02* (2013.01); *H02S 20/32* (2014.12); *H02S 40/32* (2014.12); *H02S 40/36* (2014.12)

(58) Field of Classification Search
CPC .......... H02S 99/00; H02S 20/32; H02S 40/32; H02S 40/36; H02S 20/10; B25J 11/00; (Continued)

(56) References Cited

U.S. PATENT DOCUMENTS

2007/0128821 A1\* 6/2007 Lee ................... H01L 23/49838
438/381
2009/0273241 A1\* 11/2009 Gazit ....................... H02J 1/00
307/83

(Continued)

*Primary Examiner* — Thomas C Lee
*Assistant Examiner* — Charles Cai

(57) ABSTRACT

A cost-effective solar energy collection system, including: 1) new solar PV panel wiring and power conversion system designed to allow tracking panel-to-panel shading while maintaining maximized power output, 2) the companion new combined structural and electrical inter-panel connector system supporting the new wiring scheme, and 3) the new panel structural support for the new inter-panel connector system, 4) the robotic array assembly and installation system used to assemble the new inter-panel connector and new panel structural support system into solar array sections in the field with a robotic crawler to move the assembled solar array sections to their final positions, and 5) the post system and installer for supporting the solar array sections. It is a fully integrated solar energy system for rapid installation and higher energy output which together creates a transformative change for the solar energy field.

18 Claims, 11 Drawing Sheets

Related U.S. Application Data filed on Apr. 15, 2016, provisional application No. 62/310,339, filed on Mar. 18, 2016.

(51) Int. Cl.
| | | |
|---|---|---|
| *G05B 15/02* | (2006.01) | |
| *H02S 99/00* | (2014.01) | |
| *H02S 20/32* | (2014.01) | |
| *B25J 11/00* | (2006.01) | |

(58) Field of Classification Search
CPC ...... G05B 15/02; Y02E 10/50; F24S 2020/16; F24S 2025/014; H01L 31/04
See application file for complete search history.

(56) References Cited

U.S. PATENT DOCUMENTS

| | | | |
|---|---|---|---|
| 2010/0032004 A1* | 2/2010 | Baker | F24S 30/455 |
| | | | 136/246 |
| 2014/0032178 A1* | 1/2014 | Kicinski | G06F 30/13 |
| | | | 703/1 |
| 2017/0077869 A1* | 3/2017 | Catthoor | H02J 3/38 |
| 2017/0170734 A1* | 6/2017 | Sheng | H02M 1/4258 |

\* cited by examiner

ADVANCED SOLAR PV SYSTEM WITH ROBOTIC ASSEMBLY

BACKGROUND ART

US 2016/0087132 A1—Alteneiji—Mar. 24, 2016
US 2013/0118099 A1—Scanlon—May 16, 2013
US 2013/0340807 A1—Gerwing et al.—Dec. 26, 2013
U.S. Pat. No. 9,218,013 B2—Kikinis—Dec. 22, 2015
U.S. Pat. No. 8,671,930 B2—Liao—Mar. 18, 2014
US 2014/0312700 A1—Catthoor—Oct. 23, 2014
U.S. Pat. No. 9,413,287 B2—Hartelius—Aug. 9, 2016
U.S. Pat. No. 9,472,701 B2—Goyal—Oct. 18, 2016
US 2015/0178440 A1—Fink—Jun. 25, 2015

TECHNICAL FIELD

This invention pertains to the field of Solar Photovoltaic (PV) Systems and Installation.

BACKGROUND OF THE INVENTION

Cost-effectiveness in solar energy collection systems, especially PV (photovoltaic) systems, is a combined function of their component cost, installation cost, and effective energy output. The energy output of a solar panel is generally maximized when directly facing the sun. Such panels include PV panels which directly generate electricity from light, and solar thermal panels which collect heat energy. The amount of energy collected involves several factors, two of which are the angle of the panel from a solar-direct vector and the temperature of the panel. As an example, PV panels generally collect energy well up to a 50 degree angle from the sun so long as they are not allowed to become overheated. Both the angle and the temperature are important, and recent efforts at "dressing" the mounting of the panels on the roof for "curb appeal" with concealing trim have only exacerbated the issue of panel thermal management.

There have been multiple solar panel mounting and tracking schemes used, generally falling into the following mounting categories: fixed horizontally on the ground or roof, fixed flat to angled roof, fixed angled from ground or roof, tracking on East-West horizontal axis (tracks sun's elevation from South), tracking on axis parallel to earth's axis (axis North-to-South and elevated to match latitude, follows sun from sunrise to sunset), and a "two axis tracking" system which is mounted on a single pole and which can optimally aim panels to track the sun across the sky any day of the year. Each of these mounting schemes has its advantages and disadvantages. Mounting fixed panels "angled from ground or roof" to improve their solar aim can increase the amount of energy collected, but this mounting scheme is generally not popular because it is unsightly, especially so in residential settings. Mounting "angled from the ground" or "slightly angled from the roof" is the most common commercial panel installation method. Two axis tracking optimizes the energy collection per panel.

With all panel mounting schemes, shading of any part of the solar panel has to date been deemed undesirable, especially for PV panels which have poor electrical characteristics when shaded. One aspect of the present invention is to provide a new methodology of intra- and inter-PV panel electrical wiring that is designed to specifically allow for parallel panel-to-panel shading while maintaining optimum power conversion. The secret is to realize that similarly shaded PV cells produce similar electrical outputs, and parallel panel-to-panel shading produces columns or rows within each panel with common electrical characteristics. By connecting these "shading-common" rows/columns together into long strings, either parallel or serial, you end up with an optimized conversion of "like output producing" PV cells. It is also necessary to be certain that the PV cells themselves are oriented/created to optimize shading in the design direction of the panel-to-panel shading. The same is true with shading from any long straight item that is parallel to solar panels such as a roof ridge line or roof parapet wall.

Further, net combined per area and per panel output have been limited because inter-panel shading cannot generally be tolerated. When a cell within a panel is shaded, it dramatically changes the electrical power output of that cell, especially the electrical current output. Since each "PV cell" produces a voltage of only about 0.5 VDC, many cells are strung together in series to obtain higher DC voltages before conversion to AC power is performed. Because these are "series" connections, if any one cell is shaded then its lowered current will dramatically affect the output of the whole series or "string". Many other attempts to accommodate such shading have been described, but none that openly embraces and designs for wholesale across-the-array shading as described herein. By breaking through this previously perceived inter-panel-shading limit, the net power output of an array of PV panels can be dramatically increased.

Further, existing assembly of PV arrays is a very labor intensive activity requiring many clamps and bolts, and large numbers of workers on-site. The future of the planet may well depend on acceleration of PV array installation, generating the requirement for faster assembly and lower cost installation.

DISCLOSURE OF INVENTION

This invention makes a significant increase in solar energy system cost-effectiveness by providing a fully integrated new panel, electrical, mounting, and installation system that both reduces cost and increases deployment speed. It integrates synergistic PV panel upgrades, PV electrical system upgrades, and in-the-field robotic assembly of PV arrays. This integrated system creates a disruptive leap forward facilitating rapid deployment of turn-key utility-scale and large commercial PV array solutions with significantly higher energy output per unit area.

At the core of this integrated solution is the triad of a new shade-common PV cell and panel wiring scheme, inter-panel connector system, and mounting and installation systems. Tracking solar collectors yield the highest power output per PV panel, but tracking always requires using extra land to avoid row-to-row shading. The root of this limitation is in the way solar "cells" are wired together within each panel. We present a new way to wire the panels themselves and the rows/columns of a PV array to eliminate the power degradation from row-to-row or panel-to-panel shading while tracking. The technique significantly increases overall array power output during panel-to-panel shading by allowing maximum power available from direct sunlight and adding the additional power available from full sky exposure.

This new cell and panel wiring scheme requires more connectors between panels. To make it a more cost-effective overall system a new combined electrical and structural inter-panel connector and matching structural frame system is included. These new connectors and structural frames allow panels to frame support members by "plugging" together without the use of clamps or wires, and only requiring enough bolts to connect the cross frame member to a long truss—no bolts on the panels themselves. This new structural system is further made cost effective by a new pole mount system using standard screw anchors and a pole such as used for utility poles world-wide. An automated system for installation of these poles with screw anchors is part of the cost-effective new system.

To complete the new cost-effective solar collector system, a fully self contained robotic array assembly system is described for assembly and installation of at least 1 MW of solar array in a single day directly from shipping containers and flatbed trucks with a very small but well paid support team. Delivered as a single "shipping container", the robotic PV array assembly system can easily go anywhere large solar arrays are being installed. Right now, the pace of PV deployment is set to rapidly accelerate due to market forces, and our robotic array assembly system will be a significant enabling technology for that acceleration. Robotic array assembly together with a new connector method enabled by the target wiring method can reduce the cost of large PV array installation labor costs to $0.07/W from $0.20/W, and improve density of tracking arrays to lower land cost at least 30%. The robotic assembly system is directly designed to work with the new standardized frame structure, and also includes an automated delivery crawler for moving fully completed array sections from the robotic assembly system to their final installation location such that the array section assembly robotic system need only be moved daily as a full large-scale array is built. The robotic array assembly system further can have built-in deploying wheels so the daily movements on site can be under the assembly system's own power.

All together, this new integrated solar system further facilitates design of standardized array areas and power layout schemes such that all cabling will also be standardized and readily shipped with the assembly system to each installation site to dramatically reduce on-site electrical work and to eliminate all on-site complexity. The new system turns all electrical work into a plug-n-play except utility high voltage grid interconnection. It is further possible this can facilitate "product-mode" delivery of the high-voltage grid interconnection components needed within the solar array area. The use of standardized array areas even further reduces engineering costs which have been estimated at as much as $0.16/W or 8% of overall solar array installation cost.

Regarding the new shade-common wiring scheme, when long rows of panels are tilted there will always be 3 parallel sets of cells—1) those in full sun, 2) those in full hard shade, and 3) those in partial sun/partial shade. Furthermore, in the situation with parallel rows or columns of panels, these shadows are always parallel to the rows/columns of PV cells within panels which will make power output of the cells within each of the "3 sets" of rows/columns well matched and thus well suited for optimum power conversion with an appropriately designed power conversion apparatus. The individual rows/columns of each panel can be wired completely in series based on the equally shaded rows/columns making typically 5 or 6 "sets" (equal to the numbers of rows/columns in a panel)—a wiring scheme that does not require any "selection/routing" equipment at each panel. Alternatively, a hybrid arrangement of these approaches is possible, with the common element that the power that arrives at the inverters (DC-to-AC converters) is "shade-common" and thus having common electrical conversion parameters.

This new parallel wiring scheme of a set of series "shade-common" circuits further leads to new inverter apparatus opportunities that can reduce the number of inverters required for a solar array. These options include using one (1) inverter per shade-common circuit, using a single inverter for all the circuits within parallel panels (e.g., 5-6 circuits), or using a middle number of inverters based on construction economics and the ability to combine shade-common circuits together before power conversion.

BRIEF DESCRIPTION OF DRAWINGS

The following is a description of one possible embodiment of this invention.

Figure 1:
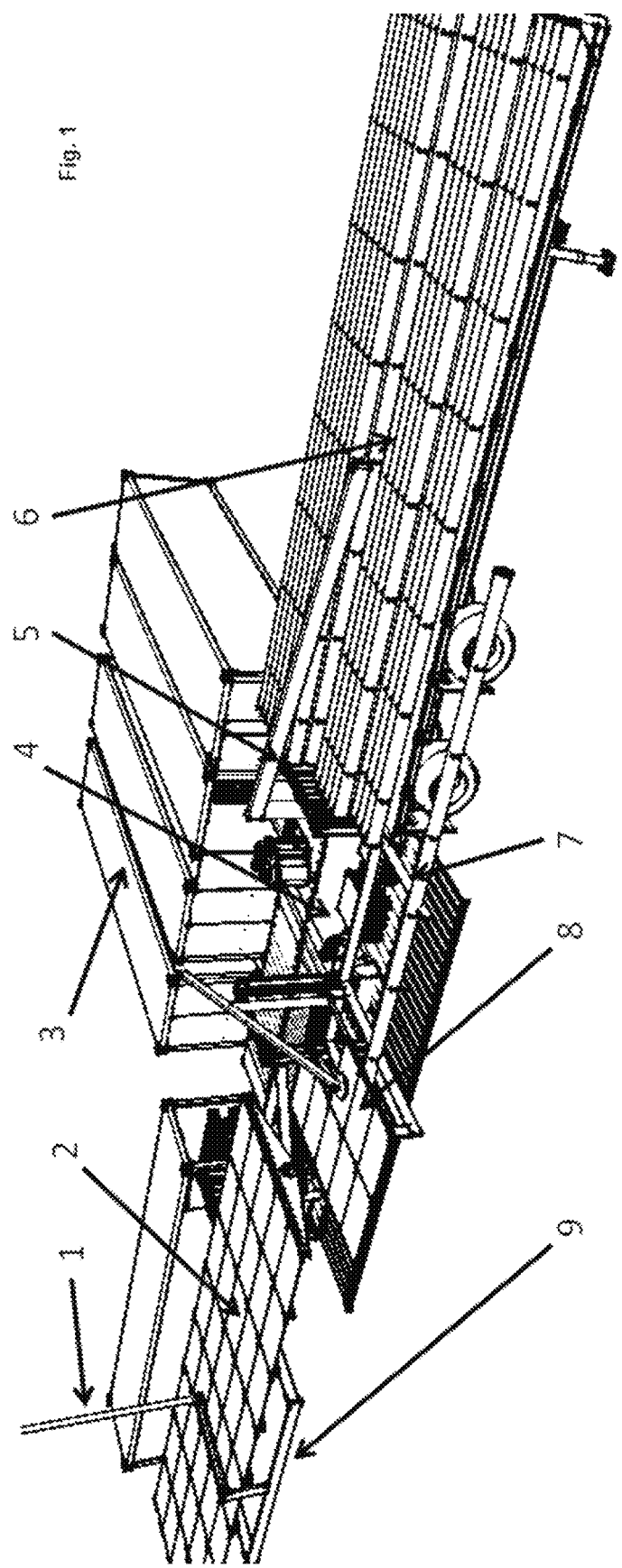
FIG. 1 is a wide view of the robotic assembly apparatus, showing the robotic system (4) with material shipping containers (3) positioned for automated off-loading, and flatbed trucks with truss sections (6) backed up to the end of the robotic system with the truss crane (5). One truss (7) is loaded onto the robotic system (4) and shown under partial assembly with already installed PV panels (8). Also shown is one fully completed array (2) in the temporary holding position, with a crane ready to lift it for final positioning with the crane attachment (9) shown attached to the crane lift cable (1).
Figure 2:
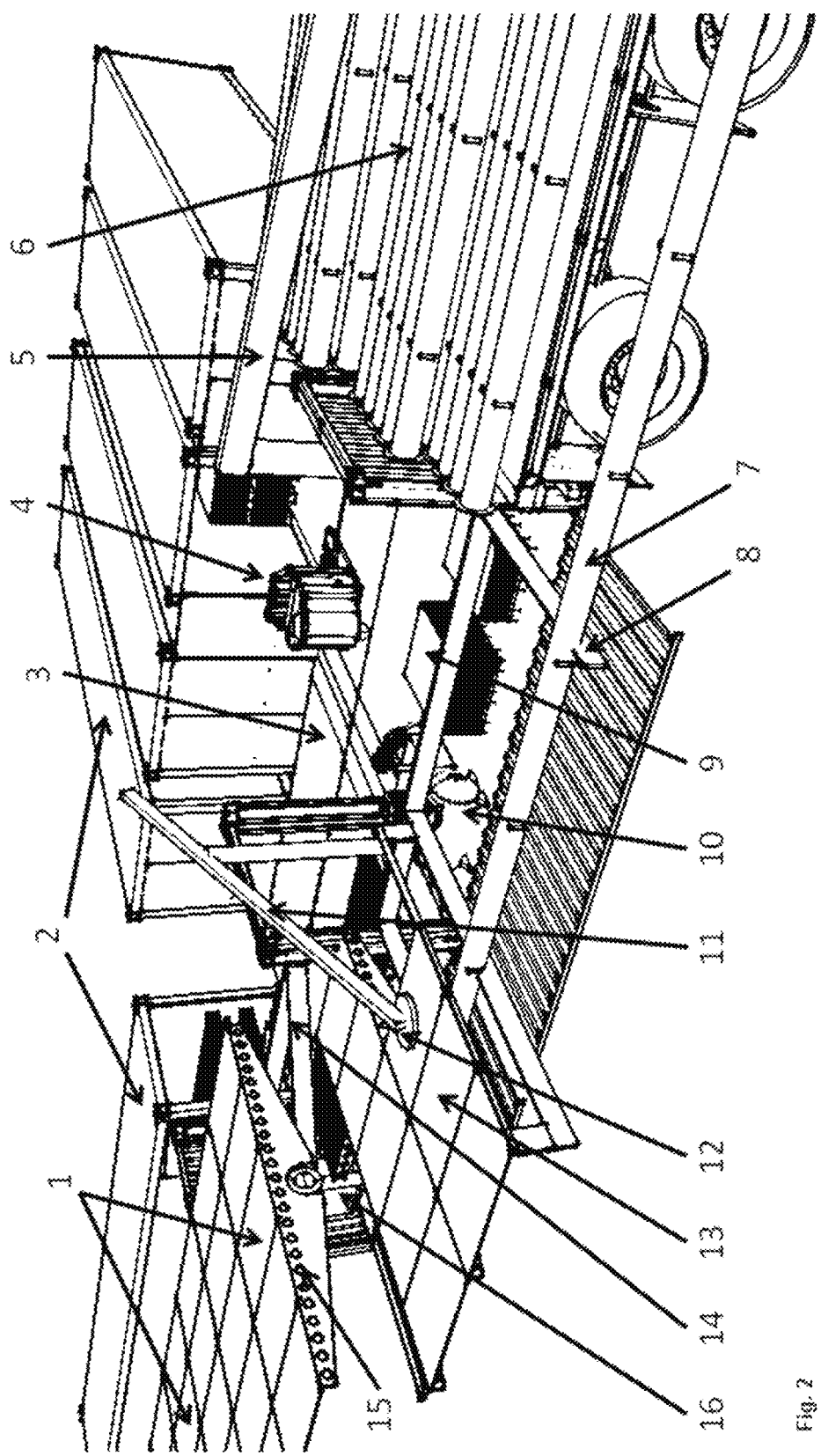
FIG. 2 is a close-up depiction of the robotic assembly system showing a completed array (1) in the holding position on a support frame (14) ready for delivery to mounting posts, with material shipping containers (2) positioned at the unfolded robotic system work platform (3) where the robotic fork lift (4) is shown here entering a container to retrieve material. Also shown is the truss crane robotic device (5) in deployed position to retrieve truss sections from the flatbed trucks (6) they are delivered on, with one truss section (7) shown loaded onto the robotic assembly systems support and automated feeding system (8). At the far end of the truss section under assembly we see a panel placement device (11) having already placed panels (13) into position using a panel lifting attachment (12). In this view you can see the holes (15) in another cross member which the combined structural/electrical connectors are inserted through for structural panel support and electrical connection to the next panel. Also shown are some of the material stacks ready for robotic assembly (9) and some of the support apparatus such as the compressor (10) and generator (16).
Figure 3:
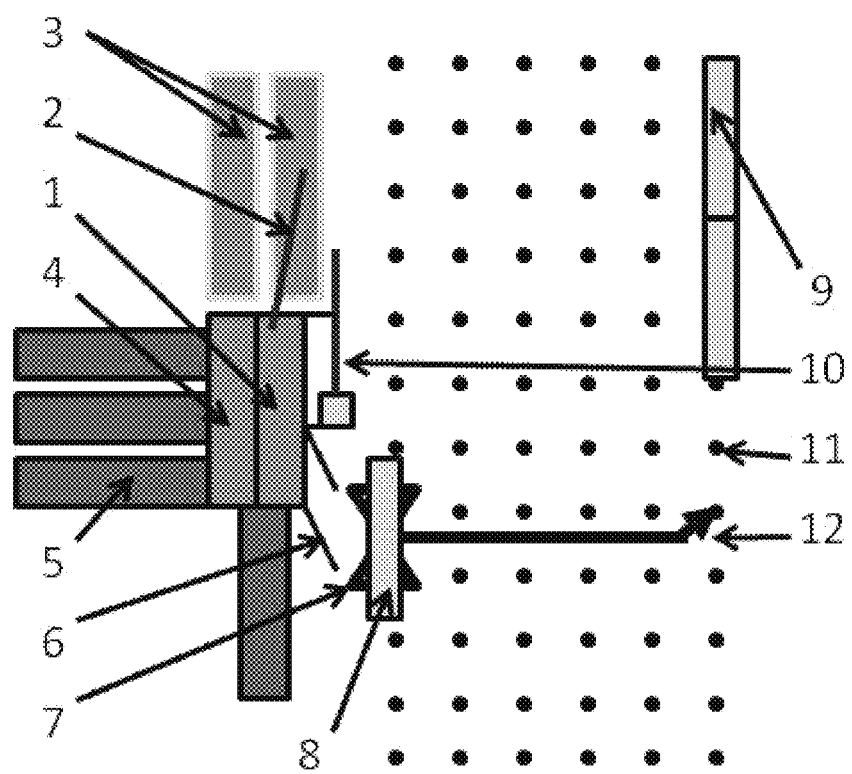
FIG. 3 shows one embodiment of an aerial view of the work layout for the robotic system (1) showing its deployed work platform (4) with material shipping containers (5) positioned for robotic unloading, and showing flat bed trucks (3) positioned at the truss crane (2) end of the robotic system with one truss and some panels (10) loaded onto the robotic assembly system and partially assembled. From the temporary holding position for completed array sections (6), shown is one completed array section (8) being moved with a robotic crawler (7) via a pre-determined path (12) to its final resting position on posts (11), with some completed array sections (9) having already been installed and more posts (11) already installed and ready for completed array sections.
Figure 4:
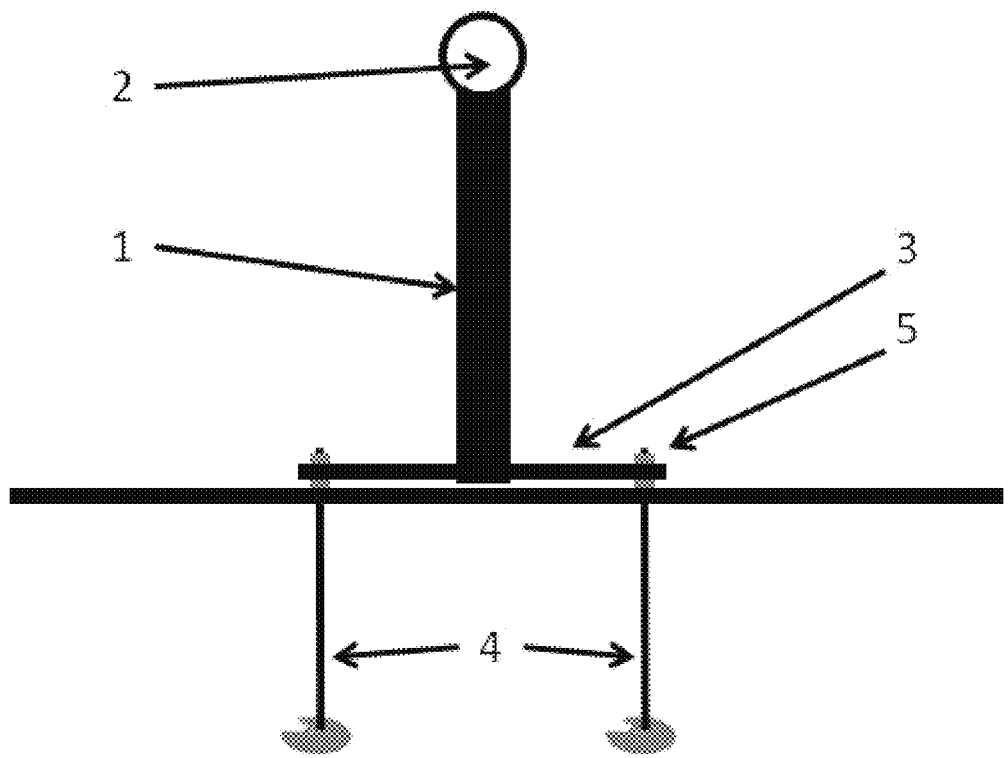
FIG. 4 shows one embodiment of a ground screw mounted post (1) where a truss section is mounted (2) in this embodiment with a base plate (3) bolted (5) to the ground anchors (4) which were screwed into the ground (6).
Figure 5:
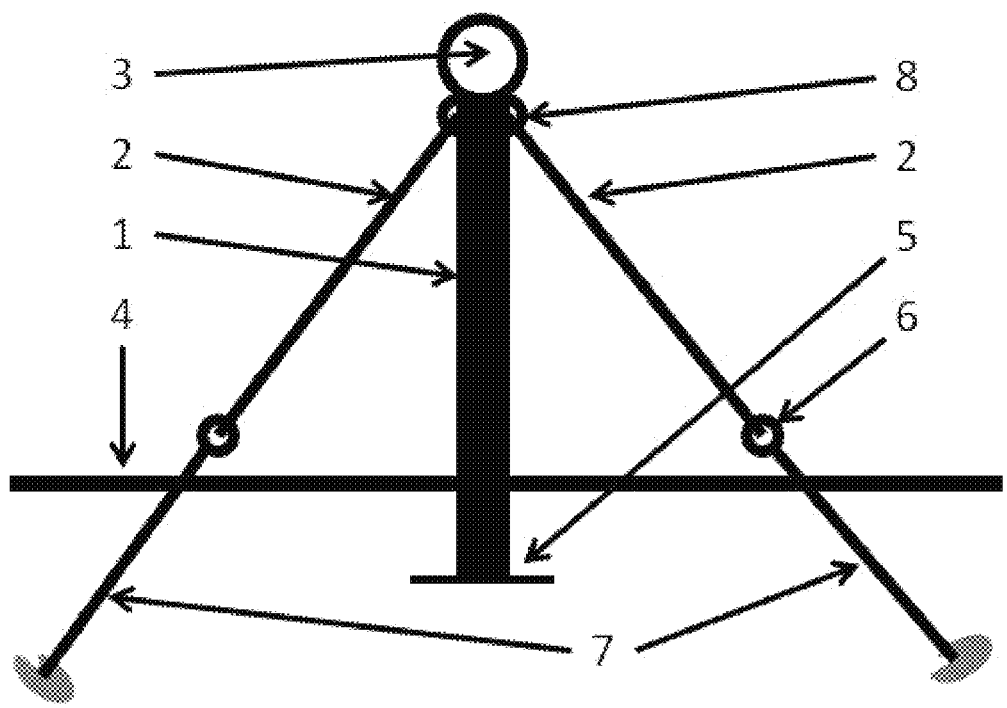
FIG. 5 shows another embodiment of a ground screw anchored post (1) where a truss section is mounted (3) with guy wires (2) attached at rings (8) on the post (1), where the post has a bottom plate (5) which is partially buried in the ground (4) and the guy wires (2) are also attached to the ground anchors (7) which were screwed into the ground at their top rings (6) to fully secure the post (1).
Figure 6:
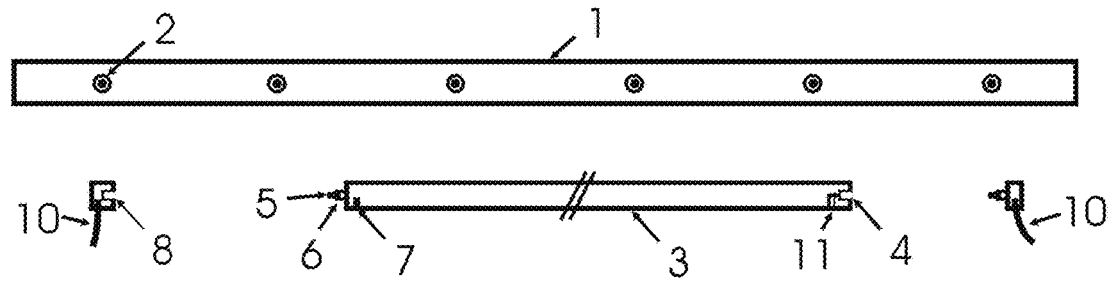
FIG. 6 is a depiction of the claimed embedded connectors for rapidly installing panels with long strings of shade-common circuits. The Panels (1 & 3) have at one end insertion connectors (2) with matching jacks on the other end of the panels. A cross section of the panel (1) is shown (3) with the insertion connector's conductor (5) on one end and jack (4) on the other end, with a sealing o-ring (6) behind the conductor (5) on the connector end to create a weather-tight seal. An optional "connector retraction" mechanism (7) is shown to allow removal and insertion of a panel in the middle of a long set of installed panels. An alternate approach to allow removal and insertion of a panel in the middle of a long set of installed panels is via a removable bottom portion (11) of the panel end containing the jacks (4) such that upon removal of the bottom portion (11), the panel can then be raised off the adjacent connectors (2/5). A set of string end connectors, jack end (8) and connector end (9) are shown with wires (10) for connecting adjacent panel strings. Connector bodies (2) and (4) provide structural support for the panels by also going through the holes in the Cross Members as shown in FIG. 2 (15). Please note the depiction of the connector (5) protruding from the body (2) is one possible embodiment for showing in the drawing, while the likely implementation is a recessed connector which would be difficult to show.
Figure 7:
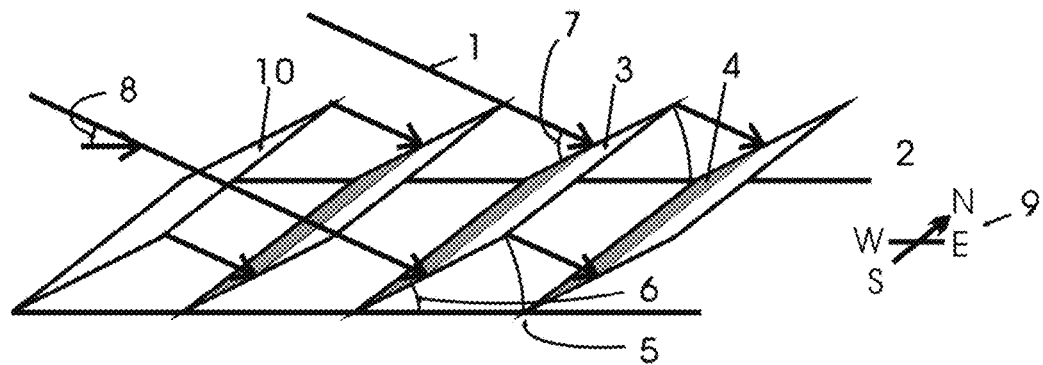
FIG. 7 is a depiction of the shading effect associated with the subject invention. Shown are solar panels (3) mounted by some means such as on racks (2) exposed to solar radiation depicted by rays shown at panel corners (1) with the solar to ground angle shown (8) and the panel to ground angle (6) with an inter-panel gap (5) and thus an effective sun-to-panel angle (7) resulting in partial panel shading (4) for all except the end panel. The compass rose (9) shows the typical orientation of the articulation shown, with this figure showing east-to-west tracking. Note there will always be a panel at the end of a set of panels that is not shaded (10), but this un-shaded panel will possibly be at alternate ends of the set of panels at different times of the day (e.g., morning versus afternoon).
Figure 8:
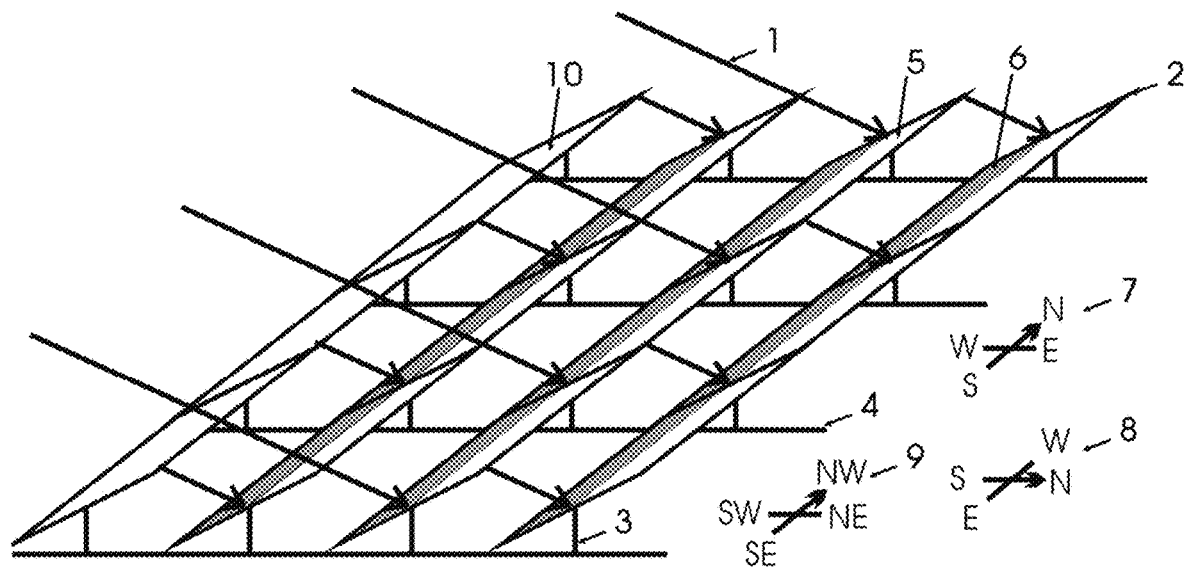
FIG. 8 is a depiction of an array of solar panels (2) on a rack system (4) this time on vertical standoffs (3) illuminated by the sun as shown by rays (1) at the panel corners thus creating areas of parallel full shade (6) and full sun (5), with possibly partially shaded cells at the boundary between the full shade (6) and full sun (5) parts of each panel. The set of compass roses (7) (8) and (9) show how this same basic configuration can be used regardless of the exact direction of the rows of panels (2)—parallel panels always produce parallel shadows and thus parallel shade-common sets of cells within panels. Also shown is the fully lit panel row (10) at one side of the array.
Figure 9:
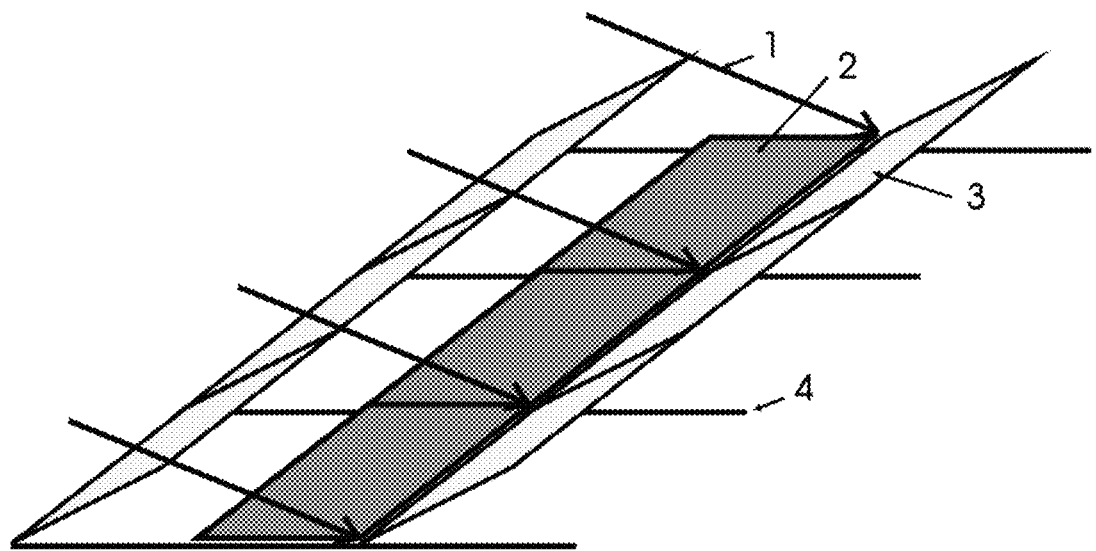
FIG. 9 is a depiction of the same shading-common solar scheme but this time where all panel sets/rows are not always articulated together to optimize net output. Shown are panels (3) on racks (4) illuminated by the sun as depicted by rays (1) effecting fully lit panels (3) and fully-shaded panels (2). The fully shaded panel (2) may sometimes be fully articulated in unison with other panels (3), and sometimes not as appropriate to maximize power output.
Figure 10:
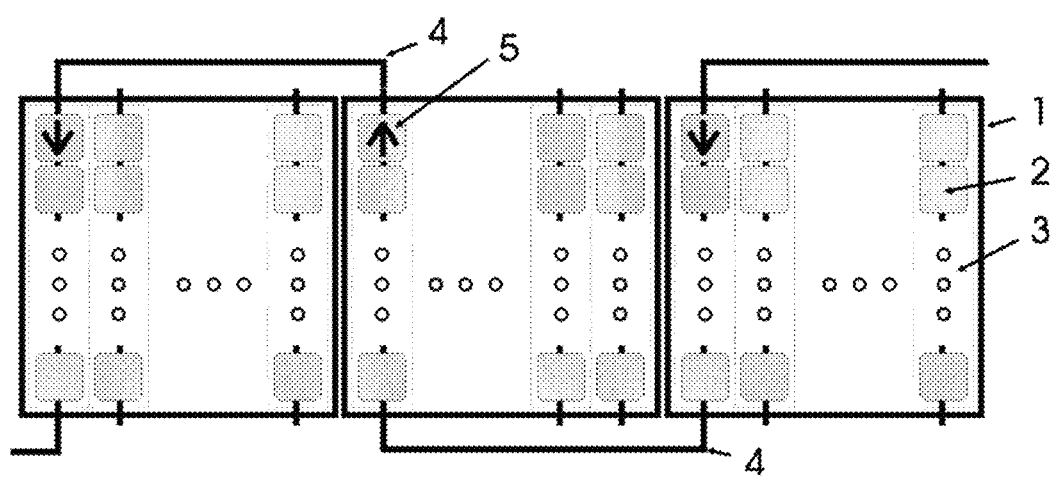
FIG. 10 shows the fundamental change to intra and inter-panel wiring associated with this invention, where panels (1) containing individual solar cells (2) are connected in series in sets (3) that are series wired (4) to the same shade-common set of solar cells in adjacent panels, and with the panels being oriented so the PV cells within the panels are oriented to conduct (5) in series. The cells are further oriented for optimum power production with shading in the parallel manner described (a function of the foil pattern on the cells).
Figure 11:
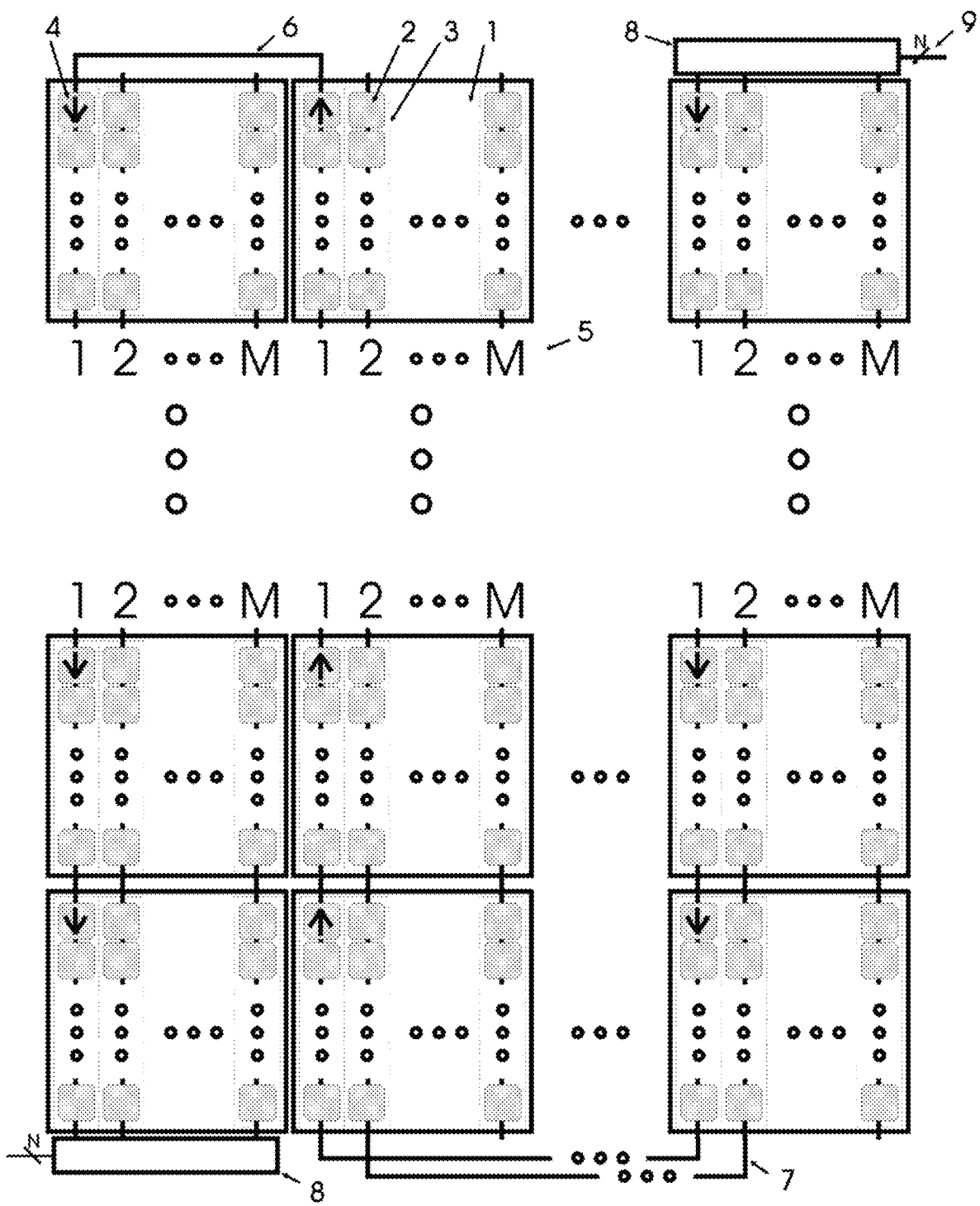
FIG. 11 shows a full array of solar panels (1) with solar PV cells (2) arranged into series wired sets (3) and oriented for proper conduction (4) with shade common sets of PV cells (3) being here labeled (5) showing the inter-panel shade common sets ("M" equals the number of columns of cells in these panels) that are wired (6 & 7) as parallel sets. Ellipses (000) depict long sets of both panels and cells in both directions. The terminal ends of the array may contain selectors (8) that will reduce the total circuits to being shaded, partially shaded, fully lit, and other variations may be used that further break down the shaded and lit output circuits (9) to optimize cost (see FIGS. 13-16).
Figure 12:
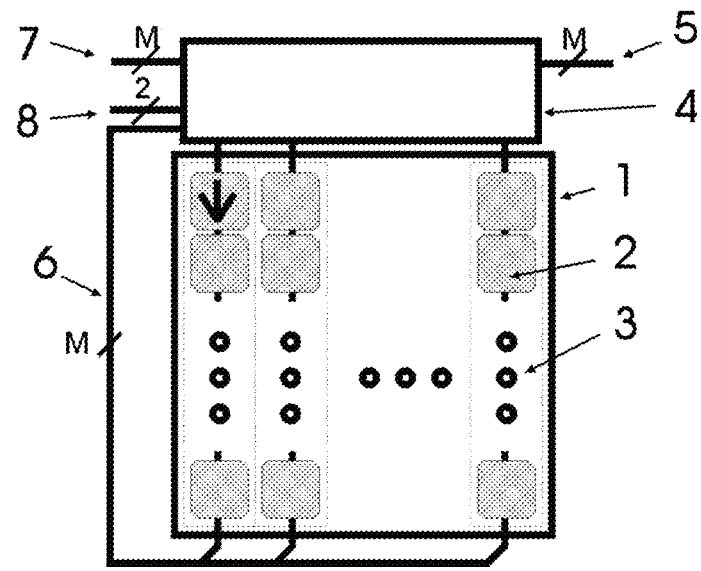
FIG. 12 shows one possible configuration for the "outer rows" of panels or end panels (see FIG. 17 item (10) and FIG. 18 item (10)) that are sometimes fully lit and sometimes shade-common with the rest of the array, where an "outer row" of panels is here depicted the same as a single "end panel" for simplicity (1), both being strings of series wired PV cells (2) forming quantity M parallel long sets of cells (3) that are wired to a switching box (4) at one end, where the switching box (4) receives the shade-common circuits (5) from the rest of the array and also has jumpers (6) from the far ends of these sets of cells, and when this panel(s) are not on the fully sun lit side of the array the switching box (4) includes these sets of cells separately with the shading-common circuitry (5) before manifesting the array output at (7), or when at the fully lit end of the array the switching box (4) isolates these sets of cells from the shade-common circuits (5) by instead connecting those shade-common circuits directly to output (7) and connecting this fully lit set of cells (1) together into a single series electrical circuit (using jumpers (6) and switching in box (4)) resulting in a separate PV circuit that is output at (8). This "outer row" circuit, or a series connection of "end panel" circuits together, are then separately converted to AC or integrated into the inverters shown in FIGS. 13 & 14 with the addition of another DC→AC converter module matched in size to this one outer row or set of end panels.
Figure 13:
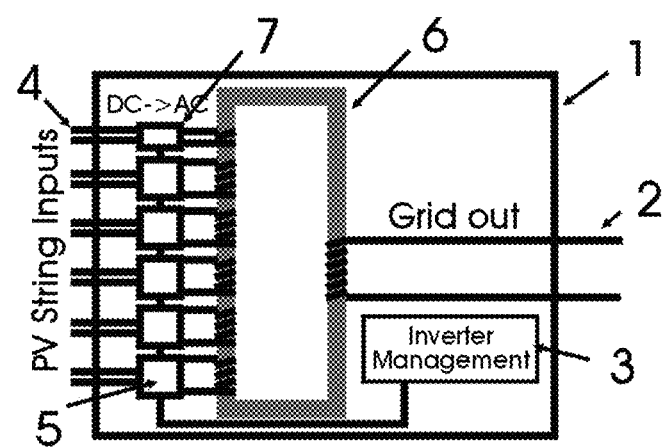
FIG. 13 shows one possible configuration of a multi-circuit integrated inverter assembly (1) that converts the multiple input circuits from the various shading-common and "outer row" circuits (4) into output "grid" power (2) under management (3) in this case using a transformer (6) for flux-additive and voltage adapted output (high volt output possible) where multiple individual DC→AC converter modules (5 & 7) are used thus limiting the size of each converter compared to the net inverter output (2), where converter (7) is shown as being smaller as needed for the partially shaded circuit which is never more than one string circuit. Another small converter can be included for the currently fully lit "outer row".
Figure 14:
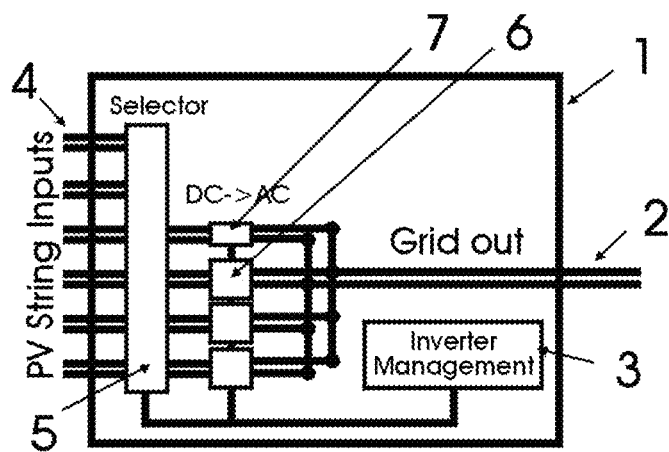
FIG. 14 shows an alternate inverter (1) approach that converts the multiple input circuits from the various shading-common and "outer row" circuits (4) into output "grid" power (2) under computer control (3) in this case using direct conversion where possible and the DC→AC converter modules (6 & 7) are sized to allow combining the inputs (4) into power-common circuits (matching V-I properties) using a Selector (5) (also depicted in FIGS. 15 & 16) thus reducing the number of converters used while also limiting their size relative to the full inverter output.
Figure 15:
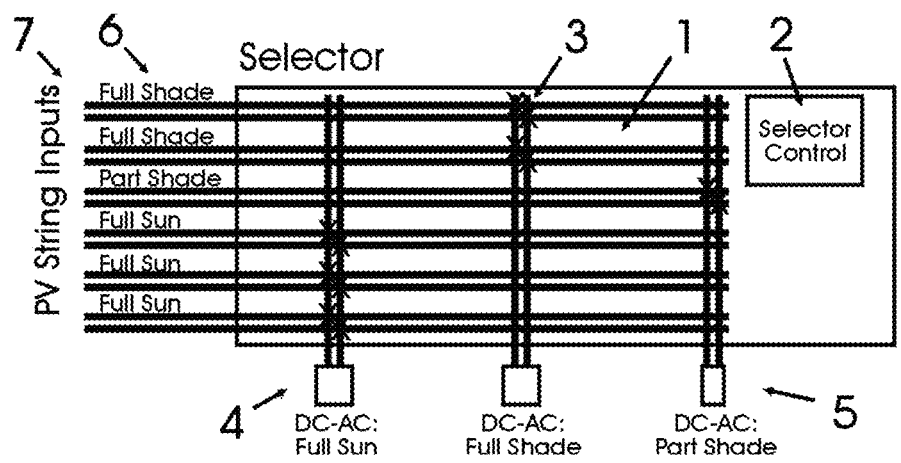
FIG. 15 is a depiction of the Selector shown in FIG. 14 (item (5)) that connects the various PV cell circuits (7) that are sometimes Full Shade sometimes Full Sun and sometimes Part Sun (6) to the DC→AC converter modules (4 & 5) using what is functionally a cross-bar switch (1) by making connections (3) where needed to connect the inputs and outputs, always under internal Selector Control (2), in this case a configuration that uses the minimum number of AC→DC converters possible being one each (4) for the Full Shade circuits and one for the Full Sun circuits and a smaller one (5) for the Part Shade circuit because it is always limited to a single shade-common array circuit. Furthermore, the Full Shade converter may be of a smaller size due to the lower power that set of circuits will produce.
Figure 16:
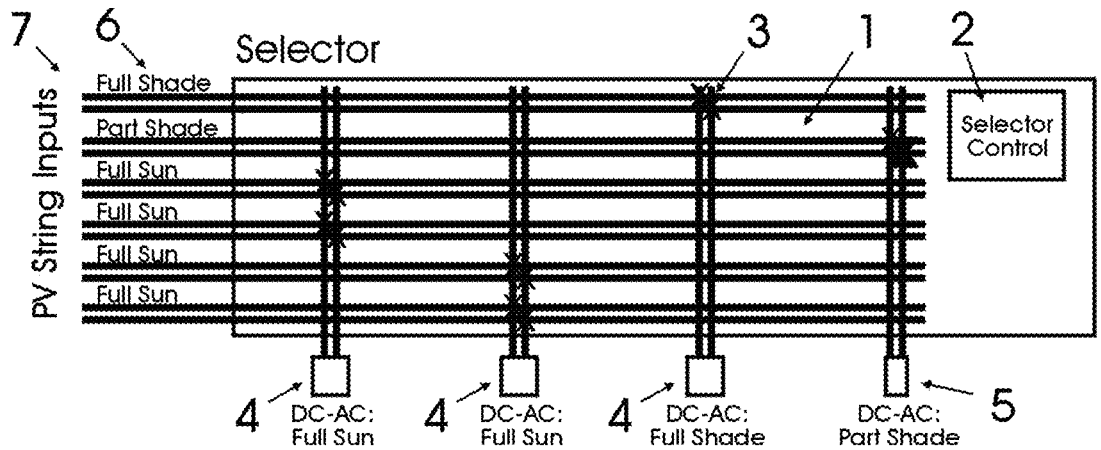
FIG. 16 is another depiction of the Selector shown in FIG. 14 (item (5)) with all the same components as for FIG. 15, but this time there are more DC→AC converters such that each one can be of significantly smaller capacity than the Full Sun converter shown in FIG. 15. The purpose of this variation is for cost and reliability management, with the ultimate balance of net inverter output size and DC→AC converter count and size being a production/product optimization issue. Shown in FIG. 16, the same six input circuits can be accommodated with DC→AC converters that will at most have to handle the power of two common circuits.
Figure 17:
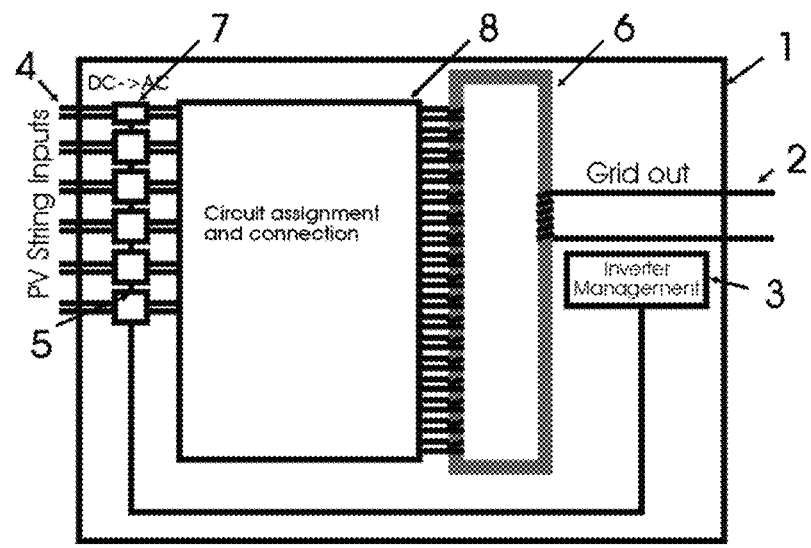
FIG. 17 shows an embodiment of a new inverter (1) capability with inputs from the solar array (4) and grid power output (2) under computational control (3) where a special transformer (6) has a large plurality of primary coils (9) that are connected in parallel and series and combined parallel/series in a circuit connection component (8) which also contains the sensors and mathematics needed to decide how best to connect the large plurality of primary coils (9) to the outputs of the primary DC to AC converters (7 down to 5) for optimum overall conversion of the solar array power to AC.
Figure 18:
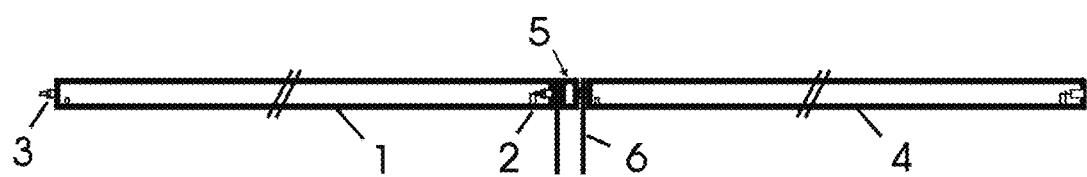
FIG. 18 shows an embodiment of a PV array circuit monitoring device (5) which is inserted between panels (1 & 4) where each panel has a protruding connector (3) and receiving connector (2) where one of the protruding connectors is not seen because it is inserted through a cross frame member (6) and into the circuit monitoring device (5). The circuit monitoring device (5) also has a protruding connector which is not seen because it is inserted through a cross frame and into the receiving connector (2) of the left panel (1). In this depiction, the circuit monitoring device (5) is shown as sandwiched between two cross members (6) as may occur at the end of a truss section, but this particular configuration is not required so long as panel structural support is properly maintained.

What is claimed:

1. An apparatus being a parallel inter-row shade embracing solar photovoltaic (PV) system with shade-common electrical circuits to allow tracking in dense arrays of many PV panels with maximized power output, wherein:
    parallel rows of PV cells within each of the many PV panels are hard wired into separate shade-common electrical circuits;
    the separate shade-common electrical circuits include a) one or more electrical circuits for rows which are fully sunlit, b) one or more circuits for rows which are fully shaded, and c) one circuit for rows which are partially shaded;
    the separate shade-common electrical circuits in each PV panel manifest to the exterior of said panel;
    all PV cells are included in circuits so no available energy is wasted; and
    the shade-common electrical circuits are each individually converted from direct current (DC) to alternating current (AC) power utilizing a transformer with a plurality of primary coils, wherein the primary coils are selectively assigned and connected to the corresponding incoming shade-common electrical circuits, and the assignments are modified dynamically to optimize overall power output while assuring no individual primary coil is overloaded.

2. The apparatus of claim 1, where the multiple shade-common electrical circuits from one panel are each connected to similarly shaded electrical circuits in next panel.

3. The apparatus of claim 1, wherein the shade-common circuits are combined into a reduced number of circuits before conversion to AC power.

4. The apparatus of claim 3, where the circuit reductions are performed within each solar panel before connection to next panel, thus reducing the number of inter-panel circuits.

5. The apparatus of claim 3, wherein the reduced number of circuits comprise one circuit for the partially shaded cells, one or more circuits selectively assigned to the fully shaded cells, and one or more circuits selectively assigned to the fully sunlit cells.

6. The apparatus of claim 3, wherein the number of circuits available for the fully shaded and fully sunlit cells is chosen to maximize cost effectiveness.

7. The apparatus of claim 3, wherein the specific assignments are dynamically determined throughout each day to minimize power loss in wires and connections and maximize total power output, and each of the reduced number of circuits are separately converted into AC power to maximize total power output.

8. The apparatus of claim 1, wherein the primary coils are both serially and parallel assigned to create optimum power conversion without overloading each coil.

9. The apparatus of claim 1, wherein the assignment is done by an embedded computer device with knowledge of voltage and current on each of the incoming shade-common electrical circuits.

10. A parallel inter-row shade embracing solar photovoltaic (PV) system, comprising shade-common electrical circuits to allow tracking in dense arrays of many PV panels with maximized power output, wherein:
    parallel rows of PV cells within each of the many PV panels are hard wired into separate shade-common electrical circuits;
    the separate shade-common electrical circuits include a) one or more electrical circuits for rows which are fully sunlit, b) one or more circuits for rows which are fully shaded, and c) one circuit for rows which are partially shaded;
    the separate shade-common electrical circuits in each PV panel manifest to the exterior of said panel;
    all PV cells are included in circuits so no available energy is wasted; and
    the shade-common electrical circuits are each individually converted from direct current (DC) to alternating current (AC) power utilizing a transformer with a plurality of primary coils, wherein the primary coils are selectively assigned and connected to the corresponding incoming shade-common electrical circuits, and the assignments are modified dynamically to optimize overall power output while assuring no individual primary coil is overloaded.

11. The PV system of claim 10, where the multiple shade-common electrical circuits from one panel are each connected to similarly shaded electrical circuits in next panel.

12. The PV system of claim 10, wherein the shade-common circuits are combined into a reduced number of circuits before conversion to AC power.

13. The PV system of claim 12, where the circuit reductions are performed within each solar panel before connection to next panel, thus reducing the number of inter-panel circuits.

14. The PV system of claim 12, wherein the reduced number of circuits comprise one circuit for the partially shaded cells, one or more circuits selectively assigned to the fully shaded cells, and one or more circuits selectively assigned to the fully sunlit cells.

15. The PV system of claim 12, wherein the number of circuits available for the fully shaded and fully sunlit cells is chosen to maximize cost effectiveness.

16. The PV system of claim 12, wherein the specific assignments are dynamically determined throughout each day to minimize power loss in wires and connections and maximize total power output, and each of the reduced number of circuits are separately converted into AC power to maximize total power output.

17. The PV system of claim 10, wherein the primary coils are both serially and parallel assigned to create optimum power conversion without overloading each coil.

18. The PV system of claim 10, wherein the assignment is done by an embedded computer device with knowledge of voltage and current on each of the incoming shade-common electrical circuits.

\* \* \* \* \*